United States Patent [19]

Lutz et al.

[11] Patent Number: 5,747,872
[45] Date of Patent: May 5, 1998

[54] FAST POWER DIODE

[75] Inventors: Josef Lutz, Nurenberg; Marianne Kinne, Altdorf; Heinz-Juergen Mueller, Nurenberg, all of Germany

[73] Assignee: Semikron Elektronic GmbH, Nurenberg, Germany

[21] Appl. No.: 492,731

[22] Filed: Jun. 20, 1995

[30] Foreign Application Priority Data

Jun. 20, 1994 [DE] Germany ............... 44 21 529.0

[51] Int. Cl.[6] ............... H01L 29/167; H01L 29/207; H01L 29/227; H01L 31/0288
[52] U.S. Cl. ............... 257/611; 257/610; 257/617; 257/656
[58] Field of Search ............... 257/610, 611, 257/617, 656

[56] References Cited

U.S. PATENT DOCUMENTS

| | | |
|---|---|---|
| 3,888,701 | 6/1975 | Tarneja et al. . |
| 3,953,243 | 4/1976 | Goetzberger et al. . |
| 4,056,408 | 11/1977 | Bartko et al. . |
| 5,063,428 | 11/1991 | Schlangenotto et al. . |
| 5,119,148 | 6/1992 | Anderson et al. . |
| 5,360,990 | 11/1994 | Swanson ............... 257/656 |
| 5,528,058 | 6/1996 | Pike, Jr. et al. ............... 257/142 |
| 5,572,048 | 11/1996 | Sugawara ............... 257/132 |

FOREIGN PATENT DOCUMENTS

A0235550  1/1987  European Pat. Off. .

OTHER PUBLICATIONS

Improved Switching Behaviour of Fast Power Diodes, W.D. Nowak, et al, AEG Research Laboratories, Frankfurt, West Germany.

Ultimate Limits of IGBT (MCT) for High Voltage Applications in conjuction with a Diode, A. Porst, Siemens AG, 81541, Munich, Germany.

*Primary Examiner*—Ngân V. Ngô
*Attorney, Agent, or Firm*—Morrison Law Firm

[57] ABSTRACT

A fast power diode with a soft switching-time response for use in a commutating branch containing a switchable semiconductor component is formed by at least three successive diffusions with p and n dopants and the heavy metal platinum, and for final incorporation of the parameters necessary for operation, the diode is irradiated with electrons.

16 Claims, 4 Drawing Sheets

FAST POWER DIODE

BACKGROUND OF THE INVENTION

The present invention relates to fast power diodes having soft switching-time response for commutating branches containing switchable components, wherein such diodes consist of an $n^-$ layer epitaxially grown on a $n^+$ substrate, with rectifying junctions formed by diffusion of highly doped $p^+$ regions. More particularly, the present invention relates to a fast power diode having a semiconductor body provided with a succession of layered zones, the middle of which has a high-resistance $n^-$ doping, which on one side is provided with a highly doped $n^+$ doping and on the other side with a $p^+$ doping.

Soft recovery diodes, or those diodes with comparatively low peak reverse current ($I_{RM}$) which decreases slowly from a peak value to a leakage current level, are known in the art.

Conventional free-wheeling diodes produce small reverse-current peaks during commutation and soft reverse-current drops after the maximum reverse-current peak. Such devices and their manufacturing processes have been described several times in the literature. See, e.g. Porst, "Ultimate Limits of an IGBT (MCT) for High Voltage Applicants in Conjunction with a Diode", *Proceedings of the 6th International Symposium on Power Semiconductor Devices & Integrated Circuits*, pp. 163–170, Session 4: IGBT 2; Davos, Switzerland (IEEE Cat. no. 94CH3377-9, 1994); and see also, Nowak et al., *POWER ELECTRONICS*, pp. 98–102 PCIM EUROPE, (April/May 1989).

Applicant's own German Patents P 43 10 444.4 and P 43 37 329.1 further provide good overviews of the state of art, and are demonstrative of issues which remain unaddressed in the field. To wit, a longstanding need exists to elucidate optimal irradiation processes for changing recombination centers and to deal with the constraint that, at higher intermediate circuit voltages, problems abound with dynamic avalanche (causing breakdown of p-n junctions).

Namely, while the behavior of free-wheeling diodes (denoted hereafter as "FWD") has been described among the prior art, improvements in their efficiency in particular applications in which they are combined with other switchable components are required. Among known FWD are those which are suitable for use together with electronic switches in the commutation phase (to transfer current from one device to another). However, a longstanding need exists to improve operational parameters for such diodes.

Attempts have been made to meet the requirements of FWD for very high-speed components such as IGBTs, and to allow for low-loss switching at frequencies greater than 20 kHz. FWD suited for high voltage, such as 1200 Volt lack desired switching characteristics, among other issues which remain to be adequately addressed.

In disclosed applications of FWD, the intermediate circuit voltage is usually 50 to 60% (Max. 75%) of the reverse voltage, which means 600 to 900 V, for a 1200 Volt device.

Conditions are different in the case of FWD for high reverse voltages of 1600 to 2000 V. Here, an intermediate circuit voltage of at least 1200 V is desired. If, for example, the process described in P 43 10 444.4 is used to apply 1600 V, using known rules at room temperature, steep commutation and high intermediate circuit voltage, a strong dynamic avalanche effect occurs which endangers the component.

Strong dynamic avalanche effects at 150 degrees C., causing the destruction of the FWD is likewise reported in the above cited Porst publication, ["Ultimate Limits of an IGBT (MCT) for High Voltage Applicants in Conjunction with a Diode" (*Proc. of the 6th TSPSD*, Davos, May 1994)], which also discusses the difficulty of using FWD with high intermediate circuit voltages. For these and related reasons, it has been discovered that the steepness must be lowered during commutation, but this, unfortunately, results in higher losses.

Among the prior art, no satisfactory solution for a FWD-wheeling is known that would meet these described requirements. It is known that the characteristics of FWD depend on the type and behavior of the recombination centers. Doping with gold as a recombination center for regulating the carrier lifetime has the advantage of causing a low voltage drop in the conducting state.

However, the gold also acts as a strong generation center at increased junction temperatures, which in the case of concentrations required for FWD leads to a very high reverse current, so that with voltages in excess of >1000 V, such diodes become unstable in reverse directions.

Doping with platinum only slightly increases the reverse current and is therefore also suitable for components with voltages in excess of >1000 V, but at room temperature this leads to a higher forward voltage. In cases with higher temperatures, the accumulated charge increases greatly in such FWD. It is very difficult in these types of cases to avoid the dynamic avalanche effect which occurs when the intermediate circuit voltage is high.

The dynamic avalanche effect is further described in an article which is entitled, "Limitation for the softness of fast rectifier diodes" (*Proceedings of the TSPSD*, PCIM 1991). This effect occurs especially in diodes with very soft switching-time response.

In sum, the advantages and disadvantages of diffusion and irradiation processes for changing the recombination centers have been described in the above-named publications and applicant's above cited German Patents. The importance of the axially different concentration of defects is most significant. At higher intermediate circuit voltages, problems occur with the dynamic avalanche in combination with electron irradiation which is required to be managed in order to regulate the basic lifetime of such devices at room temperature.

OBJECTS AND SUMMARY OF THE INVENTION

Accordingly it is an object of the present invention to provide a FWD which overcomes the drawbacks of the prior art.

It is further object of the invention to provide a FWD which is also suitable for intermediate circuit voltages larger than 1200 Volt and for steep commutation.

It is yet a further object of the invention to provide a FWD which, in addition to having a soft switching-time response, also depends as little as possible on the temperature of the storage charge.

It is yet a still further object of the invention to provide a FWD which is resistant to the dynamic avalanche effect at room temperature as well as at 150 degrees C.

It is additionally yet a still further object of the present invention to provide a FWD wherein no uncontrollable dynamic avalanche effects occur throughout its entire operating and temperature range.

Briefly stated, a fast power diode is provided with a soft switching-time response for use in a commutating branch containing a switchable semiconductor component is formed by at least three successive diffusions with p and n dopants and the heavy metal platinum, and for final incorporation of the parameters necessary for operation, the diode is irradiated with electrons.

According to a feature of the present invention, there is provided a fast power diode which comprises; a semiconductor substrate body, which semiconductor substrate body includes a plurality of layered zones, these layered zones including, at a central portion of said semiconductor substrate body, a high-resistance $n^-$ doping zone having opposing end surfaces, the high-resistance, $n^-$ doping zone being provided on one of the opposing end surface with a highly doped $n^+$ doping and on the other opposing end surface with a $p^+$ doping, the semiconductor substrate body further comprising a p/n transition in which said central portion high-resistance $n^-$ zone, through the selection of the thickness and doping concentration, has a defined reverse voltage capacity, the central portion of the $n^-$ zone and the adjacent $n^-$ outside zone including recombination centers, the semiconductor substrate body, especially the $n^-$ zone and the part of the $n^+$ outside zone which borders on the central portion being provided with additional recombination centers, means for generating a soft reverse-current, effective in the range of from room temperature up to about 150 degrees C., means for treating the recombination centers by at least one of platinum diffusion and electron irradiation.

According to a feature of the present invention, there is provided a fast power diode which comprises a semiconductor body provided with a succession of layered zones, the middle of which has a high-resistance $n^-$ doping, which on one side is provided with a highly doped $n^+$ doping and on the other side with a $p^+$ doping, said semiconductor body enclosing a p/n transition in which the middle high-resistance $n^-$ zone, through the selection of the thickness and doping concentration, has a defined reverse voltage capacity and in which said semiconductor body, especially the $n^-$ zone and the part of the $n^+$ outside zone which borders on the middle zone is provided with additional recombination centers, wherein; said fast power diode, as a FWD has a soft reverse-current behavior even with steep commutation from room temperature up to about 150 degrees C., and, dynamic avalanche effects are controlled in that said recombination centers in the middle $n^-$ zone and the adjacent $n^-$ outside zone were produced by a treatment that is including both platinum diffusion and electron irradiation, and the contribution of electron irradiation being 20% to 80% in terms of the setting of the carrier lifetime of the minority carriers.

According to yet a further feature of the present invention, there is provided a method for making a fast power diode having a soft reverse-current behavior, even with steep commutation, comprising the steps of; providing a semiconductor substrate body, diffusing the semiconductor substrate body with a least three successive diffusions with p and n dopants and platinum to produce a semiconductor body and irradiating said doped semiconductor body with electron radiation.

The above, and other objects, features and advantages of the present invention will become apparent from the following description read in conjunction with the accompanying drawings, in which like reference numerals designate the same elements.

The present invention will be explained hereinafter with reference to the accompanied drawing figures which illustrate the preferred embodiments of the present invention.

DETAILED DESCRIPTION OF THE PREFERRED EMBODIMENT

The present inventors have discovered that crucial factors for controlling the dynamic avalanche are the type of recombination centers at the $n/n^+$ junction and temperature dependence.

No conclusive indications could be found in the literature about the varying rates at which the effective cross-sections of different recombination centers depend on the temperature. It was found, however, that it is crucial to control these parameters to assure the proper functioning of a FWD for applications having these and related requirements.

In order to clarify the instant experimental results, it is first necessary to illustrate schematically the processes in a FWD with steep commutation in the phase after the reverse-current maximum $I_{RM}$. In the case of FWD having desired and necessary soft switching time response during commutation, after absorption of the applied intermediate circuit voltage, a charge carrier mound remains in the transitional zone between the n region and the $n^+$ region, and the degradation of that mound leads to a further flow of the current which itself decays gradually.

Diodes having a smaller charge carrier mound (or having strong recombination) at this $n/n^+$ transition have a snappy, i.e. hard switching-time response.

Figure 1:
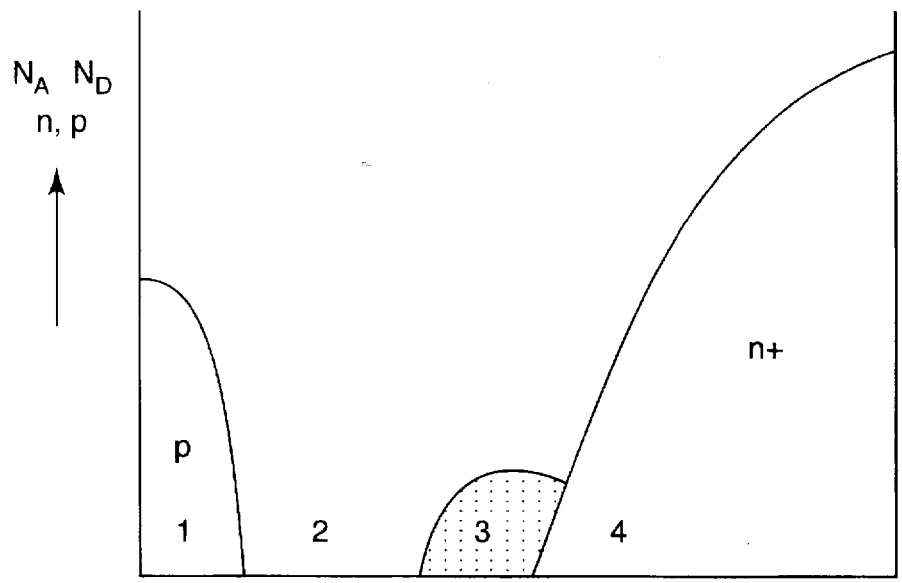
FIG. 1 is diagram which graphically plots the penetration depth of a general FWD versus the concentrations of the charge carriers on an unspecified logarithmic scale according to an embodiment of the present invention. The abscissa depicts the penetration depth while the ordinate shows the concentrations of the charge carriers.

Referring now to FIG. 1 the diagram shows the penetration depth of a general FWD (on the abscissa). Shown symbolically are the concentrations of the charge carriers at an unspecified logarithmic scale (on the ordinate). This figure illustrates schematically in regions 1 and 4 at the same time the doping profile for the FWD described below. It has a flat gradient at the $n/n^+$ transition.

Diagram region 1 shows the p+ zone of the diode. Region 2 carries the basic doping of the selected starting material which, for setting the desired lifetime of the carrier, has been radiated with electrons as an example. Diagram region 3 shows the charge carrier mound in a semi-quantitative manner, and this size can be allocated to a soft diode. Region 4 contains the heavily doped n+ side of the diode.

For forming the space-charge region, the volume of the dynamic width of the n zone (region 2) is available to the border of the charge carrier mound (region 3). If the charge carrier mound is too high or if the recombination in this charge carrier mound is too low, this can cause unpredictable dynamic avalanches.

Figure 2:
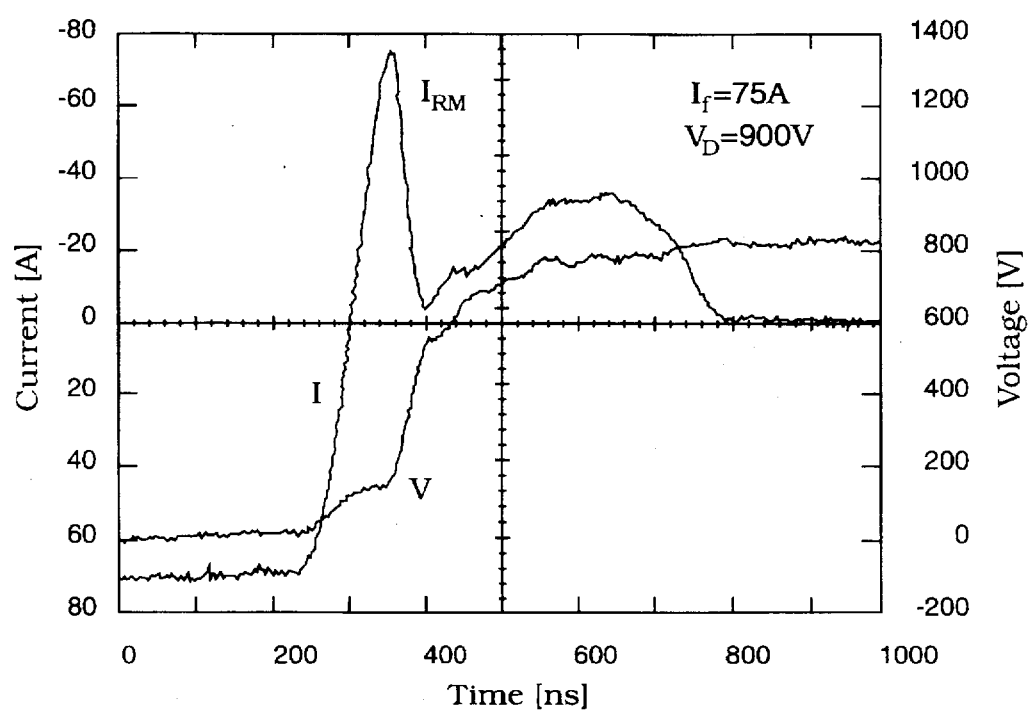
FIG. 2 graphically plots the current and voltage paths as traced by an oscillogram at the time of commutation of a FWD with the effect of a strong dynamic avalanche according to an embodiment of the present invention.

Referring now to FIG. 2, the current and voltage paths as traced by the oscillogram at the time of commutation of a FWD with the effect of a strong dynamic avalanche are shown. The bulge (charge carrier mound) of the crucial curve is clearly visible through the generation of charge carriers: it occurs at room temperature with a diode whose carrier lifetime had been regulated by means of electrode irradiation.

With this FWD, which is actually suited for a 1600 Volt static reverse voltage, a second maximum occurs starting at an intermediate circuit voltage of 879 Volt after the reverse-current maximum $I_{RM}$; this second maximum is caused by the dynamic avalanche. The bulge (charge carrier mound) increases with the intermediate circuit voltage, and if the voltage is further increased, it leads to the destruction of the component.

With such a diode, an intermediate circuit voltage of 1200 Volt is not reached at room temperature, and with the diode at working temperatures above about 50 degrees C., the bulge effect begins to decrease. The process with the bulge (charge carrier mound) is reproducible, depending on the temperature. At temperatures below 50 degrees C. it is smaller, and at temperatures above 50 degrees C. there is no bulge (charge carrier mound). This is done to regulate the lifetime of the carrier, and the diffusion parameters were chosen so that the forward voltage values of both diodes are comparable at room temperature.

Figure 3:
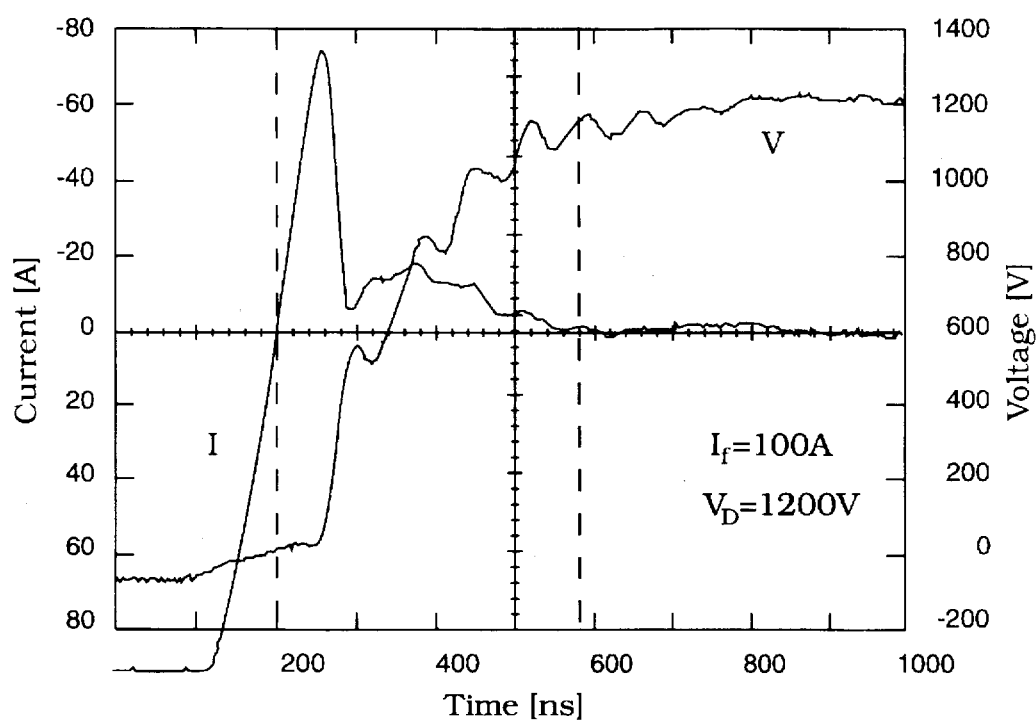
FIG. 3 is an oscillogram recorded as in FIG. 2., with the base for measurement being a diode fabricated to be identical with the measuring object shown in FIG. 2, wherein the diode was subjected not to electron irradiation, but to platinum diffusion according to an embodiment of the method of the present invention.

Referring now to FIG. 3, an oscillogram recorded in substantial analogy to that illustrated in FIG. 2 is shown. In this figure, however, the base for the measurement is a diode that was fabricated to be identical with the measuring object shown in FIG. 2, but this diode was subjected not to electron irradiation, but to platinum diffusion to regulate the lifetime of the carrier, and the diffusion parameters were chosen so that the forward voltage values of both diodes are comparable at room temperature.

The test parameters are comparable in both figures and, the intermediate circuit voltage could be increased to 1200 Volt without the occurrence of a bulge. However, if a working temperature of 150 degrees C. is selected then the platinum-diffused diode in FIG. 3 shows a very slow decrease in current after the reverse-current maximum.

Figure 4:
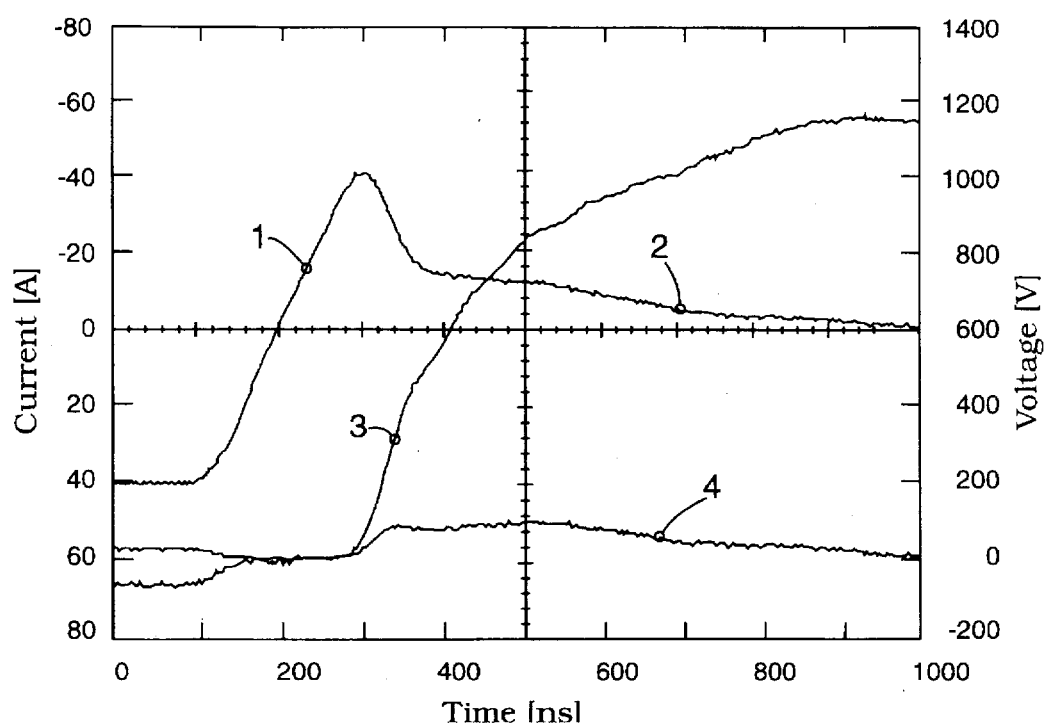
FIG. 4 is an oscillogram recorded as in FIG. 3 according to an embodiment of the method of the present invention.

Referring now to FIG. 4, an oscillogram as shown in the preceding two figures, depicts the results after the actual commutation process which is completed in about 150 ns (curve path 1), a partial current (curve path 2) follows for about 500 ns, which slowly decreases from 35 A and causes considerable losses. Curve path 3 shows the voltage following commutation, while curve path 4 represents the product of current and voltage at a given point in time.

If, in comparison, the diode in FIG. 2 is depicted under such conditions, it shows a lower and much shorter partial current, which has already decreased after 250 ns. This means that the effect of the recombination centers at the n/n+ transition in case of the platinum-diffused diode (FIG. 3), is sufficient at room temperature to keep the dynamic avalanche within a controllable range; at 150 degrees C. the effect is comparatively weak. In the sample (FIG. 2) provided with recombination centers produced by electron irradiation, the effect of the recombination centers is not sufficient at room temperature, while the effect is comparatively strong at 150 degrees C.

The recombination centers caused by platinum and by electron irradiation obviously show different effects depending on the temperature. A similar temperature-dependent behavior is found with regard to the forward voltage.

Figure 5:
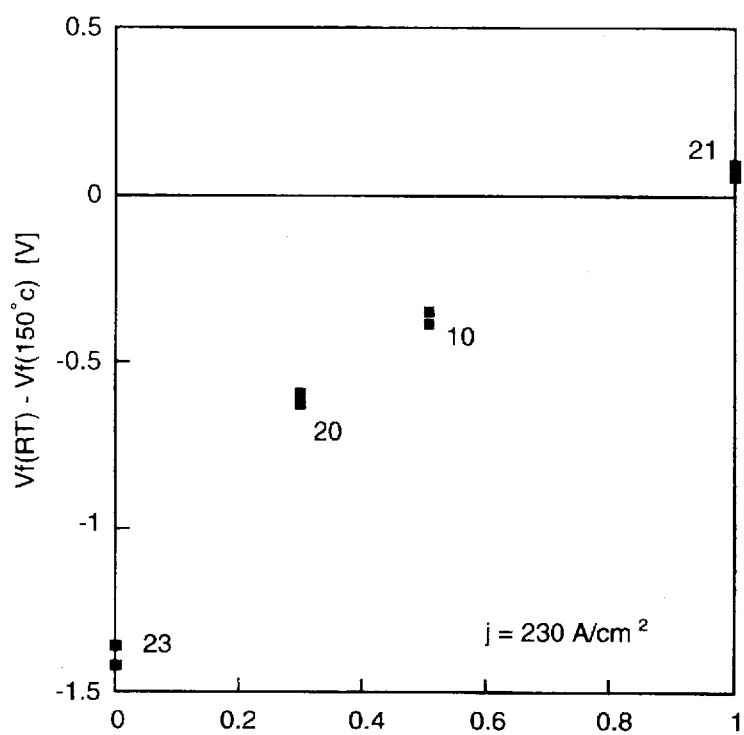
FIG. 5 is a graph plotting temperature coefficients (ordinate) at forward voltage versus the type of recombination centers formed in the vicinity of the transition from the n layer to the $n^+$ zone (abscissa: portion of electron irradiation in terms of recombination).

Referring now to FIG. 5, the diagram illustrates temperature coefficients (ordinate) at forward voltage in dependence on the type of recombination centers formed in the vicinity of the transition from the n layer to the n+ zone (abscissa: portion of electron irradiation in terms of recombination). A negative value of the ordinate means a decrease in forward voltage at increasing temperature, while a positive value means an increase.

Four types of test pieces were set up and measured. On the left ordinate the results of elements (23) are found, only diffused with platinum (the same whose switching time response is shown in FIG. 3). On the right ordinate the results (21) are found as measured by means of electron irradiated samples. In the middle of the diagram are the results of the diode samples (10, 20) in the preparation of which both methods, platinum diffusion and electron irradiation, were applied in such quantitative combination that the portion of electron irradiation is about 30% or 50% of recombination, respectively.

According to all of the test results shown in FIG. 5, the forward voltage at a current density of j=230 A/cm² and at 150 degrees C. is set to the same region.

The increase in forward voltage at increasing temperature in the sample irradiated with electrons shows that here the effect of the recombination center increases greatly with increasing temperature, although more charge carriers are present in the semiconductor volume at higher temperature, and the conductance decreases.

The strong decrease in forward voltage in the diode diffused with platinum shows that more charge carriers are present and that the conductance increases, which is to be expected with a diode at these current densities.

Furthermore, FIG. 5 shows that these results can be used to set a desired temperature coefficient in this region by specifically choosing the process parameters. This is of great importance for dimensioning modern power semiconductors whose temperature coefficients, based on the necessary circuits in parallel mode, must be as low as possible and should be positive according to the most preferred embodiments.

Figure 6:
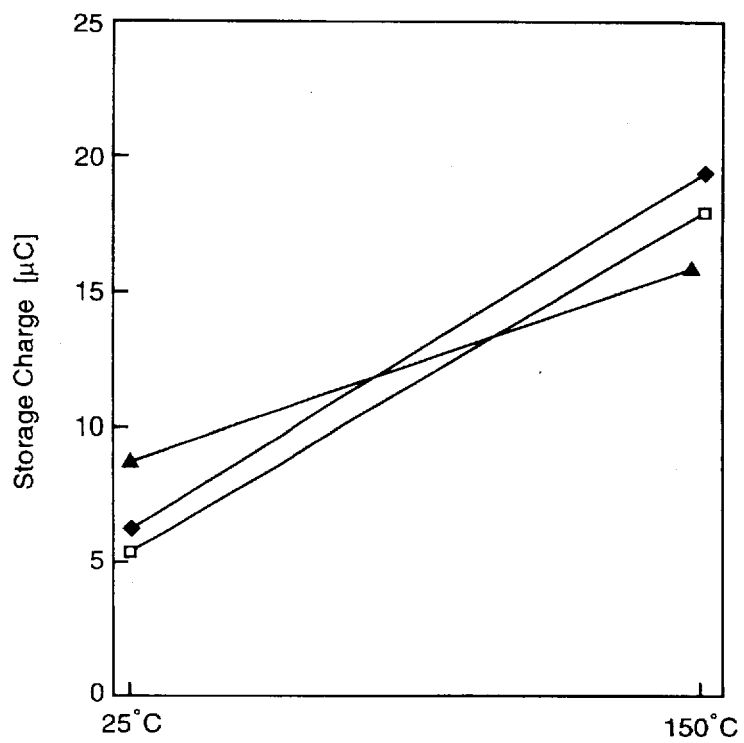
FIG. 6 is a graph showing the dependence of the storage charge on the temperature, according to the present invention.

Referring now to FIG. 6, the dependence of the storage charge on the temperature. Marked on the abscissa are the two relevant temperatures, namely room temperature (approximately 25 degrees C.) and 150 degrees C., while the storage charge is marked on the ordinate.

Measuring is done under application-oriented conditions at an intermediate circuit voltage of 1200 Volt. In diodes with platinum diffusion to regulate the carrier lifetime (lines 1 and 2), the storage charge triples during the transition from room temperature to 150 degrees C. The diodes exclusively treated with electron irradiation to regulate the carrier lifetime could not be operated under the above-named measuring conditions, since at room temperature the described parasitic effect of a dynamic avalanche occurred.

When the carrier lifetime is regulated by means of a combination of electron irradiation and platinum diffusion, the storage charge increases by less than double its value in comparison (line 3), and at 150 degrees C. it is lower than when platinum diffusion is used alone.

According to the objective of the invention, the storage charge should be as low as possible at a minimum temperature drift. As line 3 of FIG. 6 shows, the surprising inventive effect has been reached by combining the two known processes for regulating the carrier lifetime.

Figure 7:
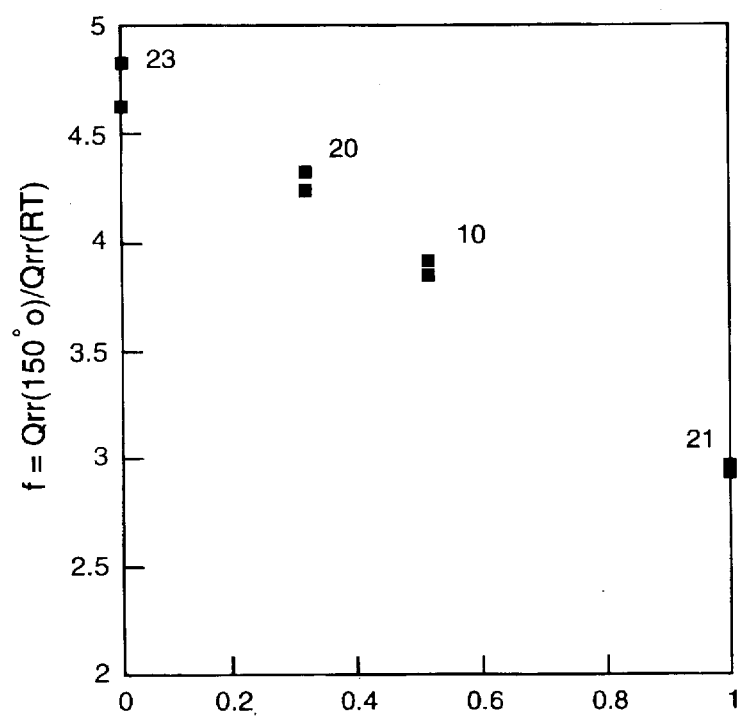
FIG. 7 is another graph plotting the dependence of the storage charge on the temperature with different compositions of recombination centers at the $n/n^+$ transition, although measuring was done with a conventional storage charge measuring device at 400 V, 100 A and a commutation of 100 A/μs.

Referring now to FIG. 7, the dependence of the storage charge on the temperature with different compositions of recombination centers at the n/n$^+$ transition is shown again (as in FIG. 6), although measuring was done with a conventional storage charge measuring device at 400 V, 100 A and a commutation of 100 A/µs. Here, no dynamic avalanche effects occur yet, and the electron irradiated sample could also be measured throughout the entire temperature range.

Marked on the ordinate is by how much the storage charge $Q_{rr}$ multiplies during transition to 150 degrees C. As the electron irradiation portion increases, a clear decrease can be recognized. The results may be correlated with the results as shown in FIG. 5.

FIG. 5, 6 and 7 contain measuring results from samples which had been provided with combined recombination centers at the n/n$^+$ transition.

The effect of the dynamic avalanche at room temperature is no longer a disturbing factor if any of the recombination centers are formed by platinum atoms. In FIG. 5, diode type 10, both methods contribute about 50% in lowering the carrier lifetime, and there is no tendency of forming bulges (charge carrier mounds).

FWD according to the invention, for high intermediate circuit voltages, will contribute to the regulation of carrier lifetime by means of platinum atoms in the recombination centers. This will avoid the dynamic avalanche effect. The contribution of platinum should be kept to a minimum, to achieve the smallest possible negative temperature coefficient of the forward voltage.

Exclusive platinum diffusion does not result in optimal operational parameters for FWD, since the temperature coefficient of the forward voltage is too negative and the storage charge at 150 degrees C. is too high, which causes very large switching power losses and under these conditions is subject to dynamic avalanche effects.

According to the findings of this invention, it is equally important to control the parameters at the p/n transition of the FWD, which is known in the prior art, so as to control the processes at the transition from the n region to the n$^+$ region for optimized FWD.

The fabrication of FWD according to the invention becomes possible, for example, by combining the process steps as described below.

After choosing a starting material suitable for high-voltage diodes, the p/n transition and the other dopant regions produced by diffusion are formed according to prior art. Immediately following, a platinum diffusion is carried out at a temperature between 820 and 900 degrees C.; the doped amount of platinum is to be adapted exactly to the requirements of the subsequent carrier lifetime.

Following the last diffusion, all passivation and metallization processes are carried out. After these steps, the characteristics to achieve the required soft recovery behavior are set by means of implanting, for example, He++ ions, as described in the publications mentioned above.

To control the parameters according the invention, the following procedural complied with:

For the instant evaluation, the current drop of the diode in forward direction (Vf) was measured. The results are reported in Table 1, which is below.

TABLE 1

| Sample (wafer) | Pt diff (temp.) | Electron Irrad. (Dosage) | Vf (100A, 150 degrees C.) (Voltage) |
|---|---|---|---|
| 23 | T1 +30 | ./. | 2.73–2.78 |
| 20 | T1 +15 | D1 | 2.66–2.73 |
| 10 | T1 | 1.2 × D1 | 2.51–2.57 |
| 21 | ./. | 2 × D1 | 2.77–2.79 |

Instead of He++ implantation, other methods are generally known which can be used to regulate soft recovery behavior. As discussed above, such alternate methods and processes are expressly set forth, or referenced in the overview of the relevant state of art which is provided in P 43 10 444.4.

The carrier lifetime is finally set by means of electron irradiation. This is done with an energy of between about 1 MeV and about 8 MeV and a dose between 100 KGy and 180 KGy. By annealing at temperatures above the subsequent soldering temperature, the impurities introduced in the diode body are fixed and stabilized.

The above described process of introducing different recombination centers with different temperature dependencies into a semiconductor body can be used with other semiconductor elements analogously to the application with FWD. By applying the technology according to the present invention, bipolar transistors, MOSFET structures or IGBT components can benefit from the optimization taught. For example, this may be done, and is contemplated by the present invention by improving the temperature dependence of parameters for the parallel operation of several power switch elements.

The concept of the present invention is also be quite useful for related applications of semiconductor elements, when dynamic avalanche effects must be reduced. In many cases, the findings according to the present invention can be directly applied and yield beneficial results.

Instead of the recombination center impurities which have been examined here, and which are produced by doping with platinum diffusion and electron diffusion, other recombination centers can be used as well. For recombination centers produced by H$^+$ or He$^{++}$ ions, a similar temperature dependent behavior can be expected because the respective physical nature is similar to that of the centers produced by electron irradiation.

For gold, as well as for other heavy metals (e.g. palladium, vanadium, and molybdenum), the temperature dependence of the capture cross-section of the effect of the recombination centers merits further attention. It is likely that further advantageous conclusions can be reached from the temperature dependence of their respective effects.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A Fast power diode comprising:

a semiconductor substrate body;

said semiconductor substrate body including a plurality of layered zones;

said layered zones including, at a central portion of said semiconductor substrate body, a high-resistance $n^-$ doping zone having opposing end surfaces;

said high-resistance, $n^-$ doping zone being provided on one of said opposing end surfaces with a highly doped $n^+$ doping zone and on another of said opposing end surfaces with a $p^+$ doping zone;

said semiconductor substrate body further comprising a p/n transition in which said high-resistance $n^-$ doping zone, through the selection of thickness and doping concentration, has a defined reverse voltage capacity;

said high-resistance $n^-$ doping zone and an adjacent $n^+$ doping zone including recombination centers;

said semiconductor substrate body, especially said high-resistance $n^-$ doping zone and a part of said $n^+$ doping zone which borders on said central portion being provided with additional recombination centers;

means for generating a soft reverse-current, effective in a range from room temperature up to about 150 degrees C.; and said recombination centers being created by electron irradiation and platinum diffusion wherein each of said electron irradiation and said platinum diffusion contributes toward setting a carrier lifetime of minority carriers.

2. Fast power diode as claimed in claim 1, wherein:

said recombination centers include a contribution of electron irradiation of between about 20% to about 80% toward setting a carrier lifetime of minority carriers.

3. Fast power diode as claimed in claim 2, wherein:

said recombination centers are effective for controlling dynamic avalanche effects.

4. Fast power diode as claimed in claim 1, wherein:

said electron irradiation contributes half to the regulation of a carrier lifetime of minority carriers of said diode.

5. Fast power diode according to claim 1, wherein:

said $n^+$ doping zone has a penetration depth of greater than 80 µm and is produced by diffusion, which results in a flat gradient of the dopant concentration at an $n/n^+$ transition.

6. Fast power diode according to claim 1, wherein:

said $n^+$ doping zone consists of a highly doped substrate; and said $n^+$ doping zone includes at least one interim layer built up with dopant concentrations between the concentrations of said $n^-$ doping zone and said $n^+$ doping zone.

7. Fast power diode according to claim 1, wherein protons or $He^{++}$ ions are implanted in said $n^-$ doping zone near said $p^+$ doping zone to produce a zone of low carrier lifetime, resulting in a soft turn-off behavior.

8. Fast power diode according to claim 1, wherein:

said platinum diffusion is carried out at a temperature of 820 degrees C. to 900 degrees C. and at a time of about 30 minutes below reducing atmosphere; and, said electron irradiation is carried out at an energy between 1 MeV and 8 MeV.

9. Fast power diode according to claim 1, wherein:

said electron irradiation stabilizes said semiconductor substrate body, through thermal treatment at temperatures between 300 degrees C. and 400 degrees C., and impurities are fixed.

10. A fast power diode which comprises a semiconductor body provided with a succession of layered zones, the middle of which has a high-resistance $n^-$ doping, which on one side is provided with a highly doped $n^+$ doping zone and on the other side with a $p^+$ doping zone;

said semiconductor body enclosing a p/n transition in which said high-resistance $n^-$ zone, through the selection of thickness and doping concentration, has a defined reverse voltage capacity and in which said semiconductor body, especially said high-resistance $n^-$ zone and a part of said $n^+$ doping zone which borders on said high-resistance$^-$ zone is provided with additional recombination centers, wherein:

said fast power diode, as a free-wheeling diode, has a soft reverse-current behavior even with steep commutation from room temperature up to about 150 degrees C., and;

dynamic avalanche effects are controlled in that said recombination centers in said high-resistance $n^-$ doping zone and said $n^+$ doping zone were produced by a treatment that is including both platinum diffusion and electron irradiation;

the contribution of electron irradiation being 20% to 80% in terms of the setting of the carrier lifetime of the minority carriers.

11. A fast power diode, comprising:

a highly doped $p^+$ layer;

a weakly doped $n^-$ layer;

a highly doped $n^+$ layer;

said weakly doped $n^-$ layer being between said highly doped $p^+$ layer and said highly doped $n^+$ layer;

a recombination center within said weakly doped $n^-$ layer and adjacent to said highly doped $n^+$ layer; and said recombination center being treated by heavy metal diffusion and irradiation.

12. The fast power diode of claim 11, wherein:

an amount of said heavy metal diffusion in said recombination center corresponds to a required carrier lifetime of said fast power diode; and an amount of said irradiation corresponds to a desired temperature coefficient of said fast power diode.

13. The fast power diode of claim 12, wherein:

said heavy metal diffusion is a platinum diffusion; and said irradiation is an electron irradiation.

14. The fast power diode of claim 11, wherein:

said heavy metal diffusion is a platinum diffusion; and said irradiation is an electron irradiation.

15. The fast power diode of claim 14, wherein each of said platinum diffusion and said electron irradiation contribute 50% to determining said carrier lifetime of said fast power diode.

16. The fast power diode of claim 11, wherein each of said heavy metal diffusion and said irradiation contributes 50% to determining said carrier lifetime of said fast power diode.

* * * * *